United States Patent
Tian et al.

(10) Patent No.: US 12,225,749 B2
(45) Date of Patent: Feb. 11, 2025

(54) DISPLAY PANEL AND DISPLAY APPARATUS

(71) Applicant: KUNSHAN GO-VISIONOX OPTO-ELECTRONICS CO., LTD, Jiangsu (CN)

(72) Inventors: Jingwen Tian, Kunshan (CN); Bing Wang, Kunshan (CN); Yin Zhang, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 540 days.

(21) Appl. No.: 17/526,347

(22) Filed: Nov. 15, 2021

(65) Prior Publication Data

US 2022/0077418 A1    Mar. 10, 2022

Related U.S. Application Data

(63) Continuation of application No. PCT/CN2020/100538, filed on Jul. 7, 2020.

(30) Foreign Application Priority Data

Oct. 24, 2019 (CN) .......... 201911018856.0

(51) Int. Cl.
*H01L 51/50* (2006.01)
*H10K 50/18* (2023.01)
(Continued)

(52) U.S. Cl.
CPC ........... *H10K 50/18* (2023.02); *H10K 85/631* (2023.02); *H10K 2101/30* (2023.02); *H10K 2102/351* (2023.02)

(58) Field of Classification Search
None
See application file for complete search history.

(56) References Cited

U.S. PATENT DOCUMENTS 10,312,464 B2 * 6/2019 Rothe .................. H10K 85/631
2008/0223445 A1    9/2008 Marks et al.
(Continued)

FOREIGN PATENT DOCUMENTS

CN      106531769 A      3/2017
CN      106654026 A      5/2017
(Continued)

OTHER PUBLICATIONS

International Search Report issued on Oct. 12, 2020 in corresponding International Application No. PCT/CN2020/100538; 4 pages.
(Continued)

*Primary Examiner* — Long Pham
(74) *Attorney, Agent, or Firm* — Maier & Maier, PLLC

(57) ABSTRACT

A display panel and a display apparatus. The display panel includes a blue light-emitting device, and the blue light-emitting device includes a first electrode, an electron blocking layer, a light-emitting layer and a second electrode which are stacked. The hole mobility of the electron blocking layer is not greater than $5 \times 10^{-4}$ cm$^2$/VS, so that electrons and holes in the light-emitting layer tend to be balanced, and luminous efficiency of the blue light-emitting device under the low luminance is improved.

18 Claims, 3 Drawing Sheets

(51) Int. Cl.
*H10K 85/60* (2023.01)
*H10K 101/30* (2023.01)
*H10K 102/00* (2023.01)

(56) References Cited

U.S. PATENT DOCUMENTS

| | | | |
|---|---|---|---|
| 2017/0222170 A1* | 8/2017 | Rothe | ............... H10K 50/155 |
| 2019/0198796 A1 | 6/2019 | Kim et al. | |

FOREIGN PATENT DOCUMENTS

| | | | |
|---|---|---|---|
| CN | 107148674 | A | 9/2017 |
| CN | 107195793 | A | 9/2017 |
| CN | 108574052 | A | 9/2018 |
| CN | 108598134 | A | 9/2018 |
| CN | 108807481 | A | 11/2018 |
| CN | 108963097 | A | 12/2018 |
| CN | 108987593 | A | 12/2018 |
| CN | 109326735 | A | 2/2019 |
| CN | 110600629 | A | 12/2019 |

OTHER PUBLICATIONS

First Office Action issued on Feb. 2, 2021 in corresponding Chinese Application No. 201911018856.0; 17 pages.

Second Office Action issued on Jun. 17, 2021 in corresponding Chinese Application No. 201911018856.0; 13 pages.

Supplementary Search Report issued on Jun. 24, 2022 in corresponding Chinese Application No. 201911018856; 3 pages including English-language translation.

Office Action issued on Jan. 7, 2022, in connection with corresponding Chinese Application No. 201911018856.0 (11 pp., including machine-generated English translation).

Supplemental Search Report with English translation issued on Dec. 31, 2021, in corresponding Chinese Application No. 201911018856.0; 3 pages.

* cited by examiner

DISPLAY PANEL AND DISPLAY APPARATUS

CROSS-REFERENCES TO RELATED APPLICATION

This is a continuation of International Patent Application No. PCT/CN2020/100538, filed Jul. 7, 2020, which claims priority to Chinese Patent Application No. 201911018856.0 filed with the CNIPA on Oct. 24, 2019, the disclosure of which is incorporated herein by reference in its entirety.

TECHNICAL FIELD

The present disclosure relates to the field of display technologies and, in particular, to a display panel and a display apparatus.

BACKGROUND

In the related art, an organic light emitting diode (OLED) display panel is widely used in the display field. However, the luminous efficiency of OLED devices with different colors will change greatly with different luminance, which makes the OLED display panel generate color shift.

SUMMARY

The present disclosure provides a display panel and display apparatus to improve the stability of the luminous efficiency of a blue light-emitting device under different luminance and mitigate the color shift of the display panel under low luminance.

In a first aspect, a display panel provided by an embodiment of the present disclosure includes a blue light-emitting device, and the blue light-emitting device includes a first electrode, an electron blocking layer, a light-emitting layer and a second electrode which are stacked.

The hole mobility of the electron blocking layer is not greater than $5 \times 10^{-4}$ cm$^2$/VS.

In a second aspect, the present disclosure further provides a display apparatus. The display apparatus includes the display panel in any one of the embodiments of the present disclosure.

DETAILED DESCRIPTION

Figure 1:
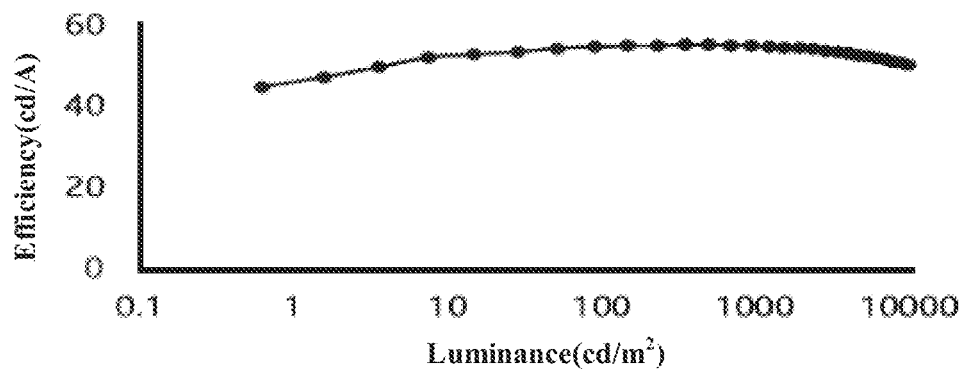
FIG. 1 is a schematic diagram showing a relationship between luminance and luminous efficiency of a red OLED.

The present disclosure will be described below in conjunction with drawings and embodiments. The embodiments described herein are merely intended to explain and not to limit the present disclosure. For ease of description, only part, not all, of structures related to the present disclosure are illustrated in the drawings.

Figure 2:
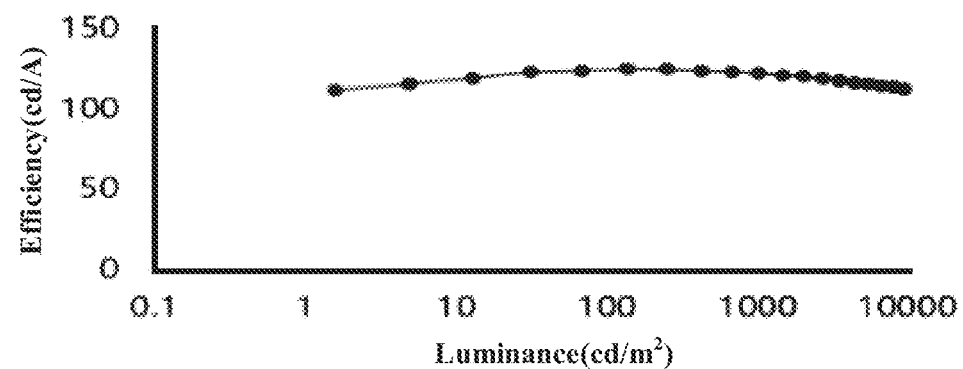
FIG. 2 is a schematic diagram showing a relationship between luminance and luminous efficiency of a green OLED.
Figure 3:
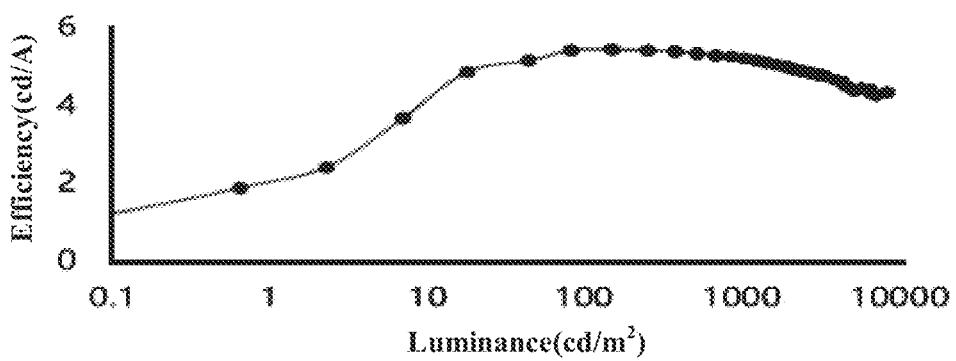
FIG. 3 is a schematic diagram showing a relationship between luminance and luminous efficiency of a blue OLED.

Generally, an OLED display panel uses three primary colours to achieve color display. The OLED display panel includes a red OLED, a green OLED and a blue OLED, where the red OLED emits red light R, the green OLED emits green light G, and the blue OLED emits blue light B. In an OLED display process, the red light R, the green light G and the blue light B may be mixed according to a certain luminance ratio to synthesize light with different colors. However, with the different luminance required for the display, the luminance of the red light R, the green light G and the blue light B will also change. With the change of luminance, the luminous efficiency of the red OLED, the luminous efficiency of the green OLED and the luminous efficiency of the blue OLED changes differently, and thus a light quantity ratio of the red light R, the green light G and the blue light B changes, resulting in the color shift in the synthesized color. For example, the mobility of the holes is greater than the mobility of the electrons in the blue OLED, so the hole content is greater than the electron content in the light-emitting layer of the blue OLED. When the blue OLED emits light with the low luminance, a voltage of the blue OLED is relatively small, and the electric field intensity formed on the light-emitting layer of the blue OLED is relatively low. In this case, the difference value between the hole content and the electron content in the light-emitting layer will be larger, resulting in lower luminous efficiency of the blue OLED under the low luminance. Under the low luminance, the difference value between the hole content and the electron content in the light-emitting layer of the red OLED and the difference value between the hole content and the electron content in the light-emitting layer of the green OLED are less than the difference value between the hole content and the electron content in the light-emitting layer of the blue OLED, and the change in the luminous efficiency of the red OLED and the change in the luminous efficiency of the green OLED are less than the change in the luminous efficiency of the blue OLED, resulting in that the light quantity ratio of the red light R, the green light G and the blue light B of the mixed color changes and thus the mixed color has a color shift. Exemplarily, FIG. 1 is a schematic diagram showing a relationship between luminance and luminous efficiency of a red OLED, FIG. 2 is a schematic diagram showing a relationship between luminance and luminous efficiency of a green OLED, and FIG. 3 is a schematic diagram showing a relationship between luminance and luminous efficiency of a blue OLED. As shown in FIGS. 1 to 3, under the low luminance, with the reduction of the luminance, the luminous efficiency of the blue OLED is decreased to a greater extent than the luminous efficiency of the red OLED and the luminous efficiency of the green OLED, and thus the light quantity ratio of the blue light B in the red light R, the green light G and the blue light B in the mixed color is decreased, resulting in the color shift of the mixed color.

Figure 4:
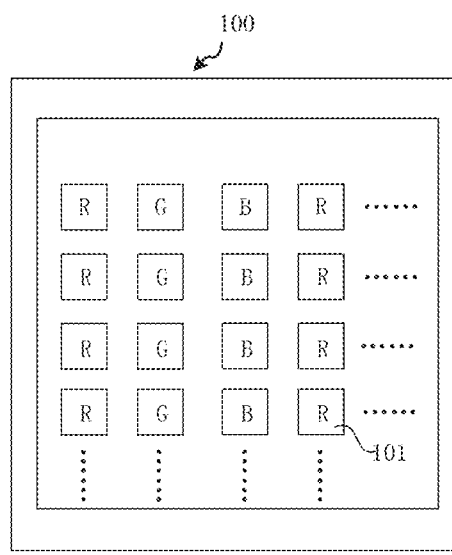
FIG. 4 is a structure diagram of a display panel according to an embodiment of the present disclosure.

An embodiment of the present disclosure provides a display panel. FIG. 4 is a structure diagram of a display panel according to an embodiment of the present disclosure. As shown in FIG. 4, the display panel 100 includes multiple light-emitting devices 101, and the multiple light-emitting devices 101 may include a blue light-emitting device B. The multiple light-emitting devices 101 may also include a green light-emitting device G, a red light-emitting device R and the like.

Figure 5:
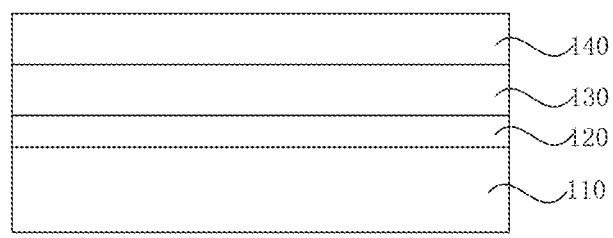
FIG. 5 is a structure diagram of a blue light-emitting device according to an embodiment of the present disclosure.

FIG. 5 is a structure diagram of a blue light-emitting device according to an embodiment of the present disclosure. As shown in FIG. 5, the blue light-emitting device includes a first electrode 110, an electron blocking layer 120, a light-emitting layer 130 and a second electrode 140 which are stacked. The hole mobility of the electron blocking layer 120 is not greater than $5 \times 10^{-4}$ cm²/VS.

In this embodiment, the first electrode 110 may be an anode, the light-emitting layer 130 may be an organic light-emitting layer, the second electrode 140 may be a cathode, and the electron blocking layer 120 is located on one side of the light-emitting layer 130 facing the first electrode 110. When the blue light-emitting device is driven to emit light, the first electrode 110 injects the holes to the blue light-emitting device, the second electrode 140 injects the electrons to the blue light-emitting device, and the holes and the electrons recombine in the light-emitting layer 130 to form excitons in an excited state. The excitons in the excited state decay in the light-emitting layer 130 and release energy in a form of light, i.e., emitting light in the light-emitting layer 130.

In this embodiment, the electron blocking layer 120 is disposed between the first electrode 110 and the light-emitting layer 130, so that when the electrons are transmitted to the light-emitting layer 130 in a direction from the second electrode 140 toward the light-emitting layer 130, the electrons are blocked in the light-emitting layer 130, thereby improving the utilization rate of the electrons, and further improving the luminous efficiency of the blue light-emitting device. Furthermore, the hole mobility of the electron blocking layer 120 is not greater than $5 \times 10^{-4}$ cm²/VS. When the holes are transmitted the electron blocking layer 120 in a direction from the first electrode 110 toward the light-emitting layer 130 to, the electron blocking layer 120 reduces the mobility of the holes, and reduces the rate of holes transmission to the light-emitting layer 130, so that the electrons and holes in the light-emitting layer 130 tend to be balanced, the difference value between the hole content and the electron content in the light-emitting layer 130 is reduced, and then the luminous efficiency of the blue light-emitting device is improved. In addition, with the increase of the luminance of the blue light-emitting device, the electric field intensity on the light-emitting layer 130 increases, the hole mobility increases, and the ability of the electron blocking layer 120 to block the holes becomes smaller and smaller relative to the migration ability of the holes under the action of electric field. That is, when the luminance of the blue light-emitting device is relatively low, the ability of the electron blocking layer 120 to block the holes is relatively large relative to the migration ability of the holes under the action of the electric field, thus reducing the rate of holes transmission to the light-emitting layer 130, and improving the luminous efficiency of the blue light-emitting device under the low luminance. In this way, the color shift caused by the low luminous efficiency of the blue light-emitting device in the display panel under the low luminance is further reduced in a case of mixing the blue light, the green light and the red light to form light of a corresponding color. Furthermore, when the luminance of the blue light-emitting device is relatively high, the ability of the electron blocking layer 120 to block the holes is relatively small relative to the migration ability of the holes under the action of the electric field, therefore, the electron blocking layer 120 does not affect the luminous efficiency of the blue light-emitting device, and the high luminous efficiency of the blue light-emitting device is ensured. Therefore, the electronic blocking layer 120 can improve the stability of the luminous efficiency of the blue light-emitting device under different luminance, and mitigate the color shift of the display panel under the low luminance in a case of mixing the light-emitting devices with different colors to form a corresponding color.

Figure 6:
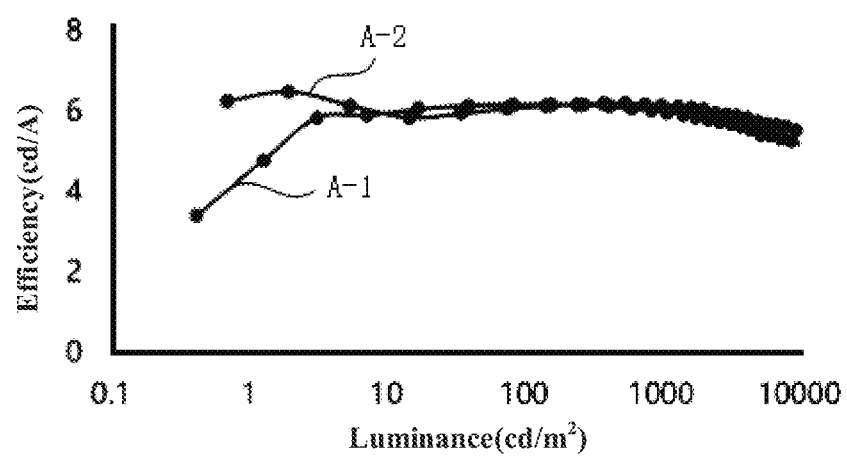
FIG. 6 is a schematic diagram of a relationship between luminance and luminous efficiency of a blue light-emitting device according to an embodiment of the present disclosure.

Exemplarily, FIG. 6 is a schematic diagram of a relationship between luminance and luminous efficiency of a blue light-emitting device according to an embodiment of the present disclosure.

As shown in FIG. 6, an abscissa represents the luminance of the blue light-emitting device, and an ordinate represents the luminous efficiency of the blue light-emitting device. A-1 is a curve of the luminance and the luminous efficiency of the blue light-emitting device whose electron blocking layer is an electron blocking layer in another embodiment, and A-2 is a curve of the luminance and the luminous efficiency of the blue light-emitting device whose electron blocking layer is the electron blocking layer provided in this embodiment. In this embodiment, the mobility of the electron blocking layer in A-1 is $5.4 \times 10^{-4}$ cm²/VS, and the mobility of the electron blocking layer in A-2 is $5.5 \times 10^{-7}$ cm²/VS. According to A-1 curve and A-2 curve, the luminous efficiency in A-2 is relatively stable relative to the luminous efficiency in A-1 under different luminance, that is, when the hole mobility of the electron blocking layer is not greater than $5 \times 10^{-4}$ cm²/VS, the stability of the luminous efficiency of the blue light-emitting device under different luminance can be improved.

Table 1 shows a relationship between the blue light-emitting efficiency and the color shift under different luminance. ΔB-Eff (L (1nit)/L (1000nit)) is a ratio of the luminous efficiency of the blue OLED at 1nit luminance to the luminous efficiency of the blue OLED at 1000nit luminance, W CIEx and W CIEy are respectively x coordinates and y coordinates of white light formed by mixing light emitted by the corresponding blue light OLED, red light OLED and green light OLED under a CIE 1931 color space (CIE 1931 XYZ), u' and v' are coordinates of the blue OLED in the CIE 1976 color space (CIELUV), respectively, and Δu'v' is a color shift extent of the white light formed by mixing the light emitted by the corresponding blue OLED, red OLED and green OLED. As shown in Table 1, with the increase of the luminous efficiency of the blue light OLED under the low luminance, Δu'v' gradually decreases, and the color shift of the white light formed by mixing the corresponding blue light, red light and green light gradually decreases, that is, the color shift of the display panel can be effectively mitigated by improving the stability of the luminous efficiency of the blue light-emitting device at different luminance.

TABLE 1

| ΔB-Eff(L(1nit)/ L(1000nit)) | W CIEx | W CIEy | u' | v' | Δu'v' |
|---|---|---|---|---|---|
| 1 | 0.3000 | 0.3150 | 0.1942 | 0.4587 | 0 |
| 0.95 | 0.3037 | 0.3213 | 0.1944 | 0.4628 | 0.00408 |
| 0.9 | 0.3076 | 0.3279 | 0.1947 | 0.4670 | 0.00826 |
| 0.85 | 0.3116 | 0.3349 | 0.1949 | 0.4713 | 0.01255 |

TABLE 1-continued

| ΔB-Eff(L(1nit)/L(1000nit)) | W CIEx | W CIEy | u' | v' | Δu'v' |
|---|---|---|---|---|---|
| 0.8 | 0.3159 | 0.3422 | 0.1952 | 0.4756 | 0.01694 |
| 0.75 | 0.3204 | 0.3498 | 0.1954 | 0.4801 | 0.02145 |
| 0.7 | 0.3251 | 0.3579 | 0.1957 | 0.4848 | 0.02607 |
| 0.65 | 0.3301 | 0.3664 | 0.1960 | 0.4895 | 0.03081 |
| 0.6 | 0.3353 | 0.3754 | 0.1963 | 0.4944 | 0.03568 |

On the basic of the above solution, a range of the hole mobility of the electron blocking layer 120 may be $1\times10^{-8} \sim 5\times10^{-4}$ cm$^2$/VS.

If the hole mobility of the electron blocking layer 120 is less than $1\times10^{-8}$ cm$^2$/VS, when the luminance of the blue light-emitting device is high, the ability of the electron blocking layer 120 to block the holes is relatively large relative to the migration ability of the holes under the action of the electric field, and the luminous efficiency and service life of the blue light-emitting device in high luminance are affected. Therefore, the hole mobility of the electron blocking layer 120 may be greater than $1\times10^{-8}$ cm$^2$/VS. In an embodiment, the hole mobility of the electron blocking layer 120 is $5.5\times10^{-7}$ cm$^2$/VS, which can make the luminous efficiency of the blue light-emitting device tend to be stable at different luminance.

On the basic of the above solution, in an embodiment, a range of a thickness of the electron blocking layer 120 is 3~20 nm.

In this embodiment, the thickness of the electron blocking layer 120 affects the ability of the electron blocking layer to block the holes. Table 2 shows a relationship between a material of the electron barrier layer and a drive voltage according to the embodiment of the present disclosure. Table 2 shows driving data when the thicknesses of the electron blocking layers of different materials are 5 nm and 20 nm, respectively. EBL-1 denotes the mobility of the electron blocking layer using $5.4\times10^{-4}$ cm$^2$/VS, and EBL-2 denotes the mobility of the electron blocking layer using $5.5\times10^{-7}$ cm$^2$/VS in this embodiment. As shown in Table 2, at the relatively high luminance, a drive voltage of the EBL-1 is less than a drive voltage of EBL-2 under the same thickness and luminance of the electron blocking layers. That is, at the relatively high luminance, under the condition of the same luminance, the hole mobility of the electron blocking layer of EBL-2 is less than the hole mobility of the electron blocking layer of the electron blocking layer of EBL-1, so that the drive voltage required for EBL-2 to reach the same luminance as EBL-1 is larger than the drive voltage required for EBL-1, and the luminous efficiency of EBL-2 is less than the luminous efficiency of EBL-1. With the thickness of the electron blocking layer increases, the difference value between the drive voltages required for EBL-1 and EBL-2 to achieve the same luminance increases, and the difference value of the luminous efficiency between EBL-1 and EBL-2 increases.

Therefore, the thickness of the electron blocking layer 120 may be disposed to be relatively thin, so that the electron blocking layer has less influence on the luminous efficiency and service life of the blue light-emitting device at the high luminance while improving the luminous efficiency at the low luminance. The range of the thickness of the electron blocking layer 120 is 3 to 20 nm, which ensures that the blue light-emitting device has high luminous efficiency at the high and low luminance while ensuring that the luminous efficiency of the blue light-emitting device at different luminance tends to be stable, thereby ensuring that the display panel has a long service life. In an embodiment, the thickness of the electron blocking layer 120 is 5 nm, and in this case, the luminous efficiency of the blue light-emitting device at different luminance is more stable.

On the basic of the above solutions, in an embodiment, a material of the electron blocking layer 120 is at least one of BPD or TDATA: R=H.

In this embodiment, a chemical formula of BPD is

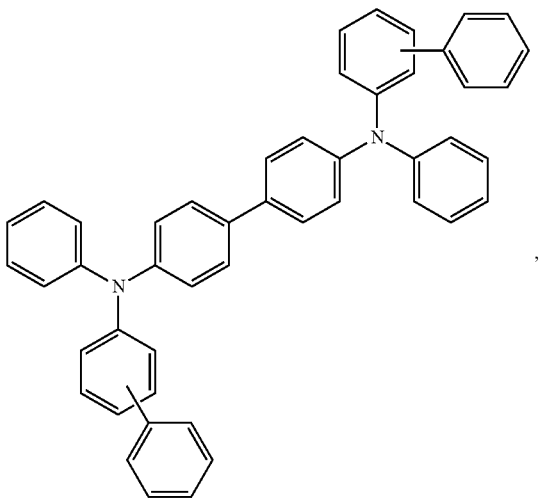

,

TABLE 2

| Light-emitting device | Thickness (nm) | Drive voltage (V) | luminance | CIEx | CIEy | Efficiency (cd/A) |
|---|---|---|---|---|---|---|
| EBL-1 | 5 | 3.61 | 1200 | 0.1427 | 0.0470 | 6.53 |
| EBL-2 | 20 | 3.74 | 1200 | 0.1429 | 0.0476 | 6.74 |
| EBL-3 | 5 | 3.90 | 1200 | 0.1459 | 0.0393 | 5.70 |
| EBL-4 | 20 | 4.47 | 1200 | 0.1461 | 0.0384 | 5.36 | and a chemical formula of TDATA: R=H is

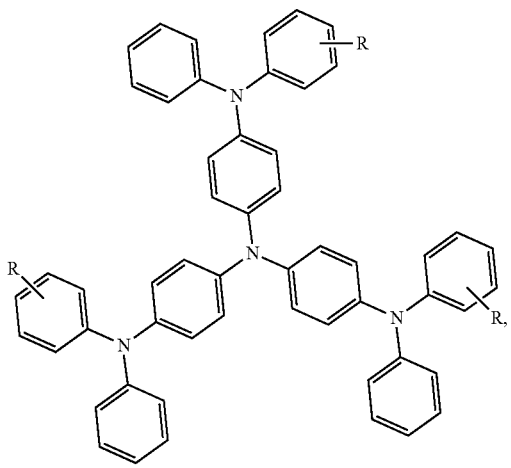

where a chemical formula of R may be

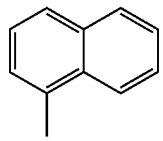

The hole mobility of BPD is $5.3\times10^{-5}$ cm$^2$/VS, and the hole mobility of TDATA: R=H is $3\times10^{-5}$ cm$^2$/VS. The hole mobility of BPD and the hole mobility of TDATA: R=H are both less than $5\times10^{-4}$ cm$^2$/VS, and the electron blocking layer 120 can ensure that the luminous efficiency of the blue light-emitting device tends to be stable at different luminance through using the above materials.

In this embodiment, the material of the electron blocking layer 120 may be one of BPD or TDATA: R=H, and in this case, the hole mobility of the electron blocking layer 120 is the hole mobility of BPD or TDATA: R=H. In other embodiments, the material of the electron blocking layer 120 may also be formed by mixing BPD and TDATA: R=H, and in this case, the hole mobility of the electron blocking layer 120 is related to the hole mobility of BPD, the hole mobility of TDATA: R=H and the mixing ratio of BPD and TDATA: R=H.

On the basic of the above solution, in an embodiment, the electron blocking layer 120 includes a biased electron-type material, and the mass ratio of the biased electron-type material to the electron blocking layer is 1:20 to 1:5.

In this embodiment, the hole mobility of the electron blocking layer 120 may be adjusted by doping the biased electron-type material in the electron blocking layer. The biased electron-type material is a material that shows apparent electrophilic reduction peaks in a case of performing a constant voltage test. In other words, the biased electron-type material is a material with relatively small hole mobility and relatively large electron mobility. The doping ratio of the biased electron-type material in the electron blocking layer can be determined according to the required hole mobility, so that the hole mobility of the electron blocking layer can be flexibly set. Under the condition that the mass ratio of the biased electron-type material to the electron blocking layer may be 1:20 to 1:5, the hole mobility of the electron blocking layer may be not greater than $5\times10^{-4}$ cm$^2$/VS. Under the condition that the mass ratio of the biased electron-type material to the electron blocking layer is less than 1:5, the hole mobility of the doped electron blocking layer being too low can be avoided, and degradation of the luminous efficiency and service life of the blue light-emitting device at high luminance caused by the low hole mobility can be avoided.

In an embodiment, the biased electron-type material may include at least one of PBD, 2PSP or OXD-7. The hole mobility of the electron blocking layer can be set more flexibly through doping one or more biased electron-type materials. In this embodiment, the PBD, the 2PSP and the OXD-7 have relatively low hole mobility, which can better regulate the hole mobility of the electron blocking layer.

In this embodiment, a molecular formula of PBD is

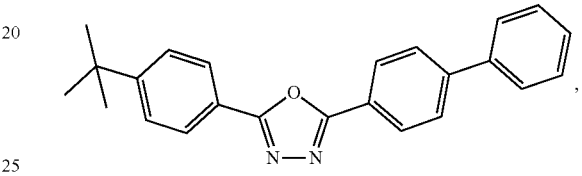

a molecular formula of 2PSP is

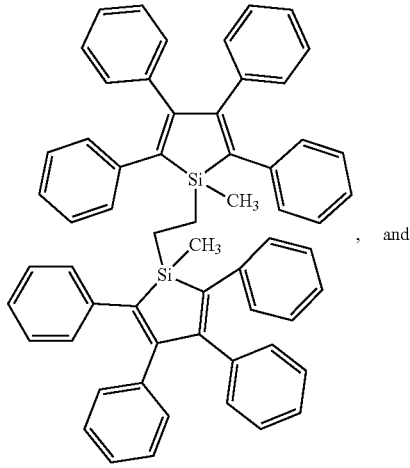 [SMILES: C[Si]1(CC[Si]2(C)C(c3ccccc3)=C(c3ccccc3)C(c3ccccc3)=C2c2ccccc2)C(c2ccccc2)=C(c2ccccc2)C(c2ccccc2)=C1c1ccccc1]

, and a molecular formula of OXD-7 is

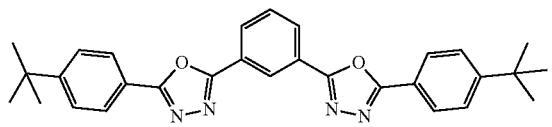

This embodiment exemplarily shows several biased electron-type materials, which does not limit the present disclosure, and in other embodiments, other biased electron-type materials can also be included.

Figure 7:
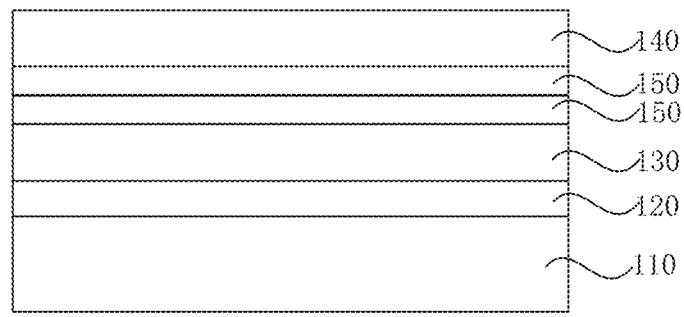
FIG. 7 is a structure diagram of another blue light-emitting device according to an embodiment of the present disclosure.

FIG. 7 is a structure diagram of another blue light-emitting device according to an embodiment of the present disclosure. As shown in FIG. 7, the blue light-emitting device further includes multiple electron-transport layers 150. The lowest unoccupied molecular orbital (LUMO) energy levels of the multiple electron-transport layers 150 increase sequentially along a direction in which the second electrode 140 points to the light-emitting layer 130.

In this embodiment, the electron-transport layers 150 are used for improving the mobility of the electrons transmitted from the second electrode 140 to the light-emitting layer 130. In an electron transmission process, there is an interlayer barrier between the second electrode 140 and the light-emitting layer 130, and multiple electron-transport layers 150 (two electron-transport layers 150 are shown in FIG. 7 as an example) whose LUMO energy levels increase sequentially are provided, so that the LUMO energy levels of multiple layers between the second electrode 140 and the light-emitting layer 130 are sequentially increased, thereby facilitating the transmission of the electrons to the light-emitting layer 130 and then increasing the electron content in the light-emitting layer 130. In this manner, the electrons and holes in the light-emitting layer 130 are further trended to balance, and the difference value between the hole content and the electron content in the light-emitting layer 130 is reduced, thereby improving the luminous efficiency of the blue light-emitting device.

On the basic of the solution, in an embodiment, a difference value between the lowest unoccupied molecular orbital energy level of the electron-transport layer and the lowest unoccupied molecular orbital energy level of the light-emitting layer is greater than 0.2 eV.

In this embodiment, the greater the difference value between the LUMO energy level of the electron blocking layer and the LUMO energy level of the light-emitting layer, the stronger the ability of the electron blocking layer to block the electrons. The difference value between the LUMO energy level of the electron blocking layer and the LUMO energy level of the light-emitting layer is disposed to be greater than 0.2 eV, thus ensuring the ability of the electron blocking layer to block the electrons.

Figure 8:
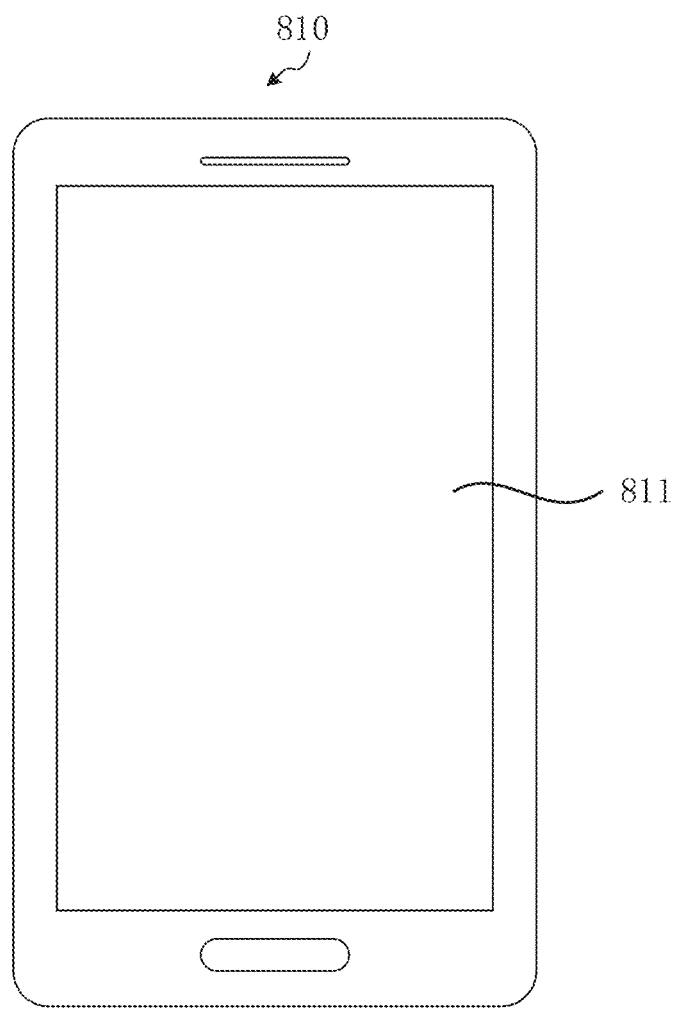
FIG. 8 is a structure diagram of a display apparatus according to an embodiment of the present disclosure.

An embodiment of the present disclosure further provides a display apparatus. FIG. 8 is a structure diagram of a display apparatus according to an embodiment of the present disclosure. As shown in FIG. 8, the display apparatus 810 includes the display panel 811 described in any one of embodiments of the present disclosure. The display apparatus may be an electronic display product such as a mobile phone, a tablet PCs, a wearable device and the like.

The display apparatus provided in this embodiment includes the display panel provided in any embodiment of the present disclosure. For technical details detailed in this embodiment, please refer to the display panel provided in any embodiment of the present disclosure.

What is claimed is:

1. A display panel, comprising:
a blue light-emitting device,
wherein the blue light-emitting device comprises a first electrode, an electron blocking layer, a light-emitting layer and a second electrode which are stacked; and
wherein hole mobility of the electron blocking layer is not greater than $5 \times 10^{-4}$ cm$^2$/VS, the electron blocking layer comprises a biased electron-type material, and a mass ratio of the biased electron-type material to the electron blocking layer is 1:20 to 1:5.

2. The display panel of claim 1, wherein a range of a thickness of the electron blocking layer is 3 to 20 nm.

3. The display panel of claim 2, wherein a thickness of the electron blocking layer is 5 nm.

4. The display panel of claim 1, wherein the material of the electron blocking layer is at least one of BPD or TDATA: R=H.

5. The display panel of claim 1, wherein the biased electron-type material is at least one of PBD, 2PSP or OXD-7.

6. The display panel of claim 1, wherein a range of the hole mobility of the electron blocking layer is $1 \times 10^{-8}$ to $5 \times 10^{-4}$ cm$^2$/VS.

7. The display panel of claim 6, wherein the hole mobility of the electron blocking layer is $5.5 \times 10^{-7}$ cm$^2$/VS.

8. The display panel of claim 1, wherein the blue light-emitting device further comprises a plurality of electron-transport layers, and lowest unoccupied molecular orbital energy levels of the plurality of electron-transport layers increase sequentially in a direction in which the second electrode points to the light-emitting layer.

9. The display panel of claim 1, wherein a difference value between a lowest unoccupied molecular orbital energy level of the electron-transport layer and a lowest unoccupied molecular orbital energy level of the light-emitting layer is greater than 0.2 eV.

10. The display panel of claim 1, wherein the first electrode is an anode, which is configured to inject electrons into the blue light-emitting device in a case where the blue light-emitting device emits light.

11. The display panel of claim 1, wherein the second electrode is a cathode, which is configured to inject holes into the blue light-emitting device in a case where the blue light-emitting device emits light.

12. The display panel of claim 1, wherein the light-emitting layer is an organic light-emitting layer.

13. A display apparatus, comprising the display panel of claim 1.

14. The display apparatus of claim 13, wherein the display apparatus is a mobile phone, a table PC or a wearable device.

15. The display apparatus of claim 13, wherein a range of a thickness of the electron blocking layer is 3 to 20 nm.

16. The display apparatus of claim 15, wherein a thickness of the electron blocking layer is 5 nm.

17. The display apparatus of claim 13, wherein the material of the electron blocking layer is at least one of BPD or TDATA: R=H.

18. The display apparatus of claim 13, wherein the biased electron-type material is at least one of PBD, 2PSP or OXD-7.

* * * * *